US012578652B2

(12) United States Patent　　(10) Patent No.:　US 12,578,652 B2
Lin et al.　　　　　　　　　　　(45) Date of Patent:　　Mar. 17, 2026

(54) PHOTOMASK AND METHODS FOR MEASURING AND MANUFACTURING THE PHOTOMASK

(71) Applicant: TAIWAN SEMICONDUCTOR MANUFACTURING COMPANY, LTD., Hsinchu (TW)

(72) Inventors: Ping-Hsun Lin, New Taipei City (TW); Chien-Cheng Chen, Hsinchu County (TW); Shih Ju Huang, New Taipei City (TW); Pei-Cheng Hsu, Taipei City (TW); Ta-Cheng Lien, Hsinchu County (TW); Hsin-Chang Lee, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 701 days.

(21) Appl. No.: 17/900,937

(22) Filed: Sep. 1, 2022

(65) Prior Publication Data

US 2024/0077804 A1　　Mar. 7, 2024

(51) Int. Cl.
　　*G03F 1/44*　　　　(2012.01)
　　*G03F 1/24*　　　　(2012.01)
　　*G03F 7/00*　　　　(2006.01)
(52) U.S. Cl.
　　CPC ............ *G03F 7/70441* (2013.01); *G03F 1/24* (2013.01); *G03F 1/44* (2013.01)

(58) Field of Classification Search
None
See application file for complete search history.

(56) References Cited

U.S. PATENT DOCUMENTS

| | | | |
|---|---|---|---|
| 6,122,056 A | * | 9/2000 | Hibbs ................... G01N 21/45 |
| | | | 356/450 |
| 8,764,995 B2 | | 7/2014 | Chang et al. |
| 8,796,666 B1 | | 8/2014 | Huang et al. |
| 8,828,625 B2 | | 9/2014 | Lu et al. |
| 8,841,047 B2 | | 9/2014 | Yu et al. |

(Continued)

FOREIGN PATENT DOCUMENTS

| | | | | |
|---|---|---|---|---|
| CN | 102369588 B | * | 12/2016 | ............... G03F 1/58 |
| DE | 10351972 A1 | * | 6/2005 | ............... G03F 1/44 |

(Continued)

*Primary Examiner* — Martin J Angebranndt

(74) *Attorney, Agent, or Firm* — Birch, Stewart, Kolasch & Birch, LLP

(57) ABSTRACT

A method includes forming a test pattern and a reference pattern in an absorption layer of a photomask structure. The test pattern has a first trench and a second trench, the reference pattern has a third trench and a fourth trench, the test pattern and the reference pattern have substantially the same dimension in a top view, and the second trench is deeper than the first trench, the third trench, and the fourth trench. The method further includes emitting a light beam to the test pattern to obtain a first interference pattern reflected from the test pattern, emitting the light beam to the reference pattern to obtain a second interference pattern reflected from the reference pattern; and comparing the first interference pattern with the second interference pattern to obtain a measured complex refractive index of the absorption layer.

20 Claims, 15 Drawing Sheets

(56)                References Cited

U.S. PATENT DOCUMENTS

| 8,877,409 | B2 | 11/2014 | Hsu et al. | |
| 9,093,530 | B2 | 7/2015 | Huang et al. | |
| 9,184,054 | B1 | 11/2015 | Huang et al. | |
| 9,256,123 | B2 | 2/2016 | Shih et al. | |
| 9,529,268 | B2 | 12/2016 | Chang et al. | |
| 9,548,303 | B2 | 1/2017 | Lee et al. | |
| 2006/0099517 | A1* | 5/2006 | Sugawara | B82Y 40/00 |
| | | | | 430/311 |
| 2013/0280643 | A1* | 10/2013 | Hsu | H01L 21/0337 |
| | | | | 430/5 |
| 2014/0205938 | A1* | 7/2014 | Yu | G03F 1/24 |
| | | | | 430/5 |
| 2015/0009509 | A1* | 1/2015 | Kim | G01B 11/0691 |
| | | | | 356/503 |
| 2016/0357099 | A1* | 12/2016 | Kim | G03F 1/22 |
| 2021/0033960 | A1* | 2/2021 | Hsu | G03F 1/70 |
| 2021/0208497 | A1* | 7/2021 | Maeda | G03F 7/20 |
| 2021/0382398 | A1* | 12/2021 | Xiao | G03F 1/24 |
| 2022/0252453 | A1* | 8/2022 | Hirano | G01J 3/18 |
| 2022/0357600 | A1* | 11/2022 | Fonte | B29D 12/02 |
| 2022/0357660 | A1* | 11/2022 | Chen | G01Q 60/24 |

FOREIGN PATENT DOCUMENTS

| JP | H05142755 | A | * | 6/1993 | |
| JP | 2005101399 | A | * | 4/2005 | |
| JP | 2018031982 | A | * | 3/2018 | |
| JP | 2019012184 | A | * | 1/2019 | |
| JP | 2020166114 | A | * | 10/2020 | |
| KR | 20190033421 | A | * | 3/2019 | G02B 27/52 |
| KR | 20210061177 | A | * | 5/2021 | G03F 7/70283 |

* cited by examiner

140'
130
120
110

105

140'
130
120
110

105

900

800

PHOTOMASK AND METHODS FOR MEASURING AND MANUFACTURING THE PHOTOMASK

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are desired. For example, the need to perform higher resolution lithography processes grows. One of the leading next-generation lithography techniques is an extreme ultraviolet (EUV) lithography. Others include X-Ray lithography, ion beam projection lithography, and electron-beam projection lithography.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-9B illustrate a method for manufacturing the test photomask at various stages in accordance with some embodiments of the present disclosure.

DETAILED DESCRIPTION

Figure 1:
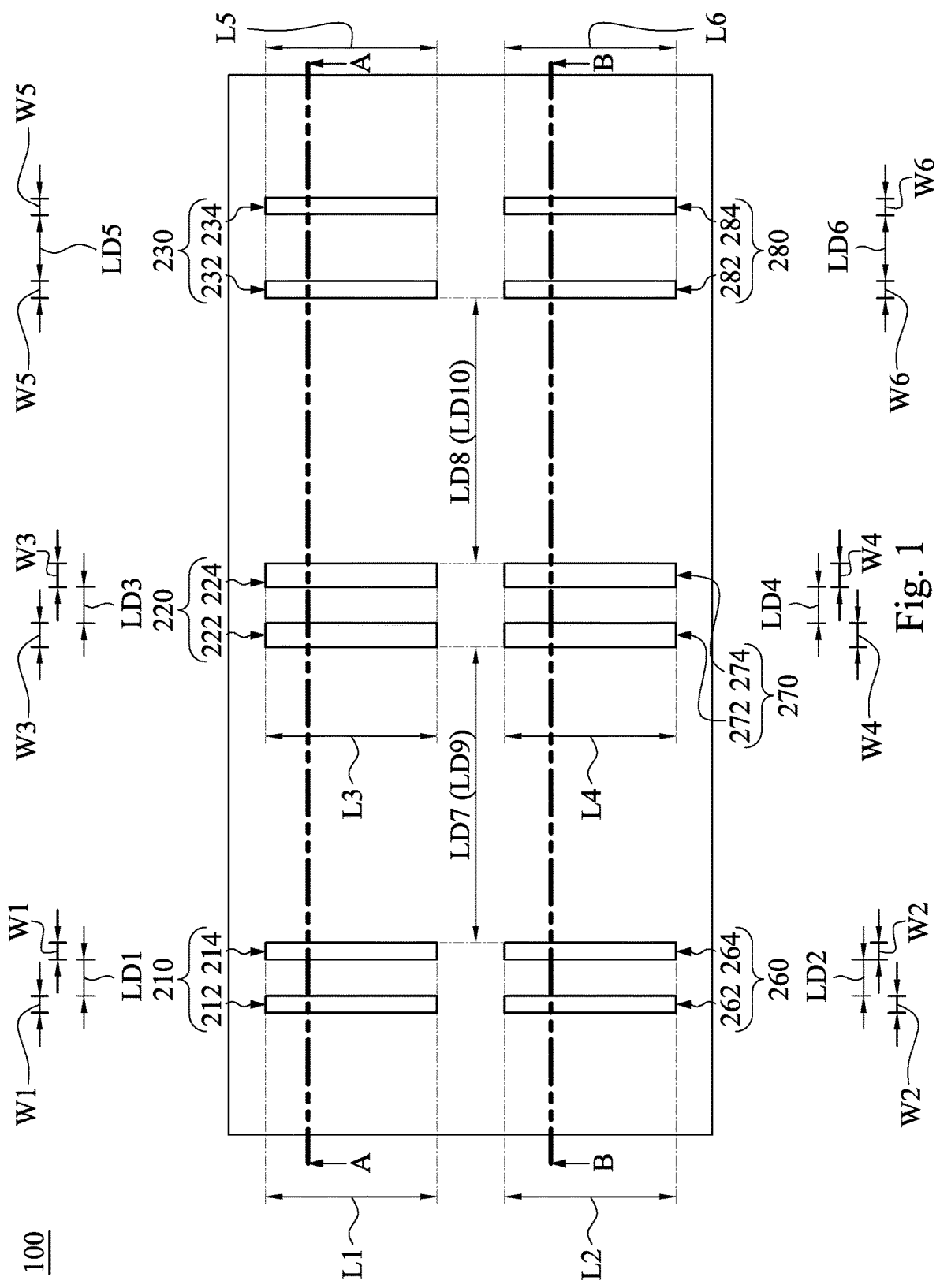
FIG. 1 is a top view of a test photomask in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is related to test patterns of photomasks and methods for measuring a refractive index of an absorption layer of the photomasks. A photomask may include an absorption layer which has patterns therein. When a light beam impinges on the absorption layer of the photomask during a lithography exposure process, the light beam is patterned by the pattern in the absorption layer. The patterned light beam is then reflected to a photoresist layer of a wafer to expose the photoresist layer.

Specifically, the light beam propagates in the absorption layer, such that not only the patterns therein, but also the refractive index of the absorption layer determines the propagations of the light beam. If the refractive index of the absorption layer is out of a predetermined range, the optical properties (e.g., phase shift and/or propagation length) of the patterned light beam are shifted, resulting in an incorrect exposure pattern in the photoresist layer. Therefore, some embodiments of the present disclosure provide test patterns in the absorption layer and methods for measuring the refractive index of the absorption layer with the use of the test patterns.

Figures 2A, 2B:
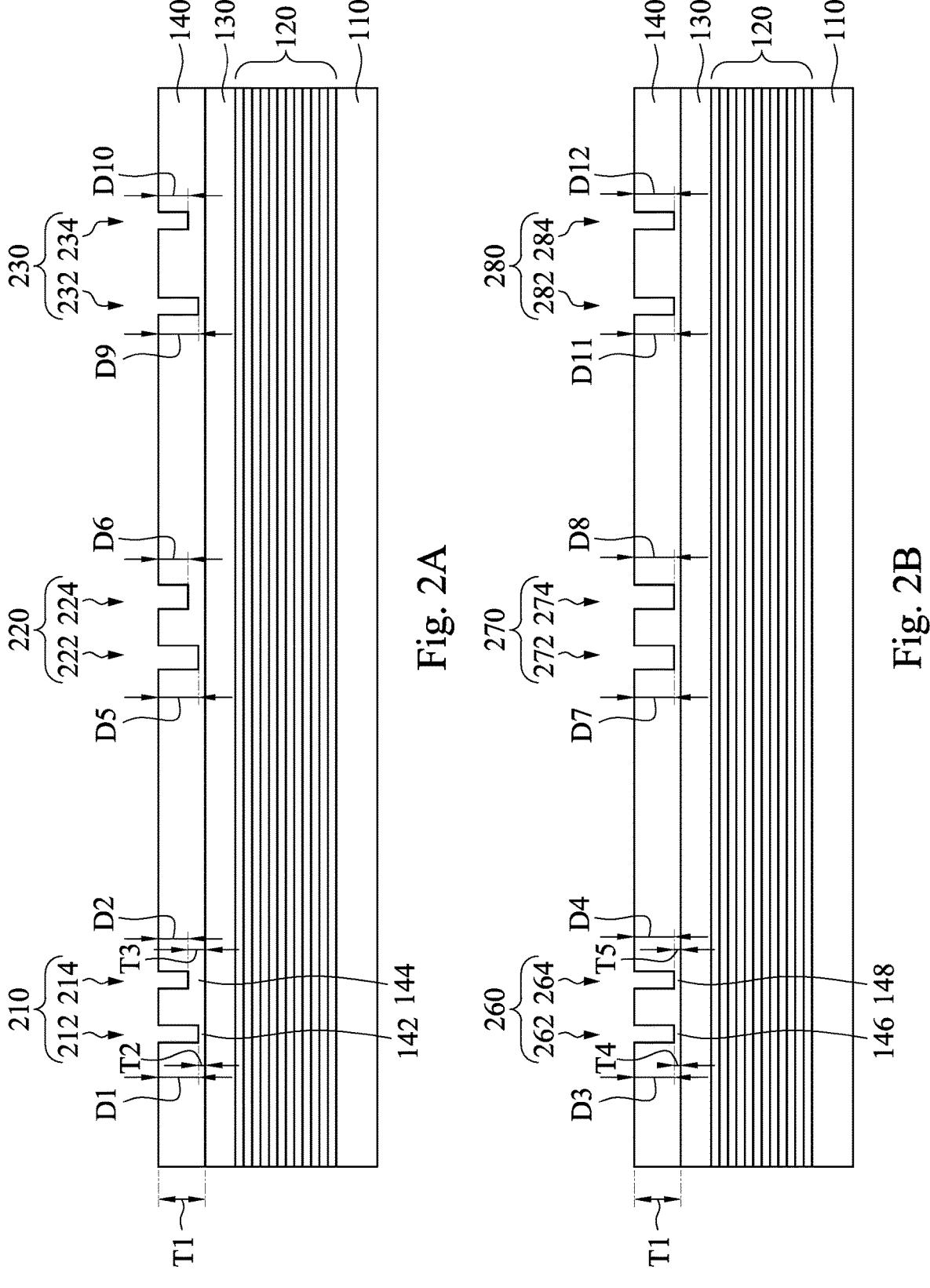
FIG. 2A is a cross-sectional view taken along line A-A of FIG. 1.
FIG. 2B is a cross-sectional view taken along line B-B of FIG. 1.

FIG. 1 is a top view of a test photomask 100 in accordance with some embodiments, FIG. 2A is a cross-sectional view taken along line A-A of FIG. 1, and FIG. 2B is a cross-sectional view taken along line B-B of FIG. 1. The test photomask 100 includes a substrate 110. The substrate 110 may be a low thermal expansion material (LTEM) substrate including LTEM glass, quartz, silicon, silicon carbide, black diamond, and/or other suitable low thermal expansion substances. The substrate 110 serves to minimize image distortion by mask heating. In some embodiments, the substrate 110 includes materials with a low defect level and a smooth surface.

A reflective multilayer (ML) 120 is disposed over the substrate 110. The reflective ML 120 includes a large number of alternating layers of materials having a high refractive index and a low refractive index. A material having a high refractive index has a tendency to scatter EUV light and on the other hand, a material having a low refractive index has a tendency to transmit EUV light. Pairing these two type materials together provides a resonant reflectivity. The ML 120 includes a plurality of film pairs, such as molybdenum-silicon (Mo/Si) film pairs (e.g., a layer of molybdenum above or below a layer of silicon in each film pair). Alternatively the ML 120 may include molybdenum-beryllium (Mo/Be) film pairs, or any material that is highly reflective at EUV wavelengths can be utilized for the ML 120. The thickness of each layer of the ML 120 depends on the EUV wavelength and the incident angle. The thickness of the ML 120 is adjusted to achieve a maximum constructive interference of the EUV light reflected at each interface and a minimum absorption of the EUV light by the ML 120. The ML 120 may be selected such that it provides a high reflectivity to a selected radiation type/wavelength (e.g., reflectivity of 70%). A typical number of film pairs is 20-80, however any number of film pairs is possible. In some embodiments, the ML 120 includes forty pairs of layers of Mo/Si. Each Mo/Si film pair has a thickness of about 5 nm to about 7 nm.

A capping layer 130 is formed on the ML 120 to prevent oxidation of the ML during a mask patterning process and an absorber layer repairing process. In addition, the capping layer 130 acts as an etch stop in an absorption layer patterning process. In some embodiments, the capping layer 130 has different etch characteristics than the absorption layer. The capping layer 130 includes ruthenium (Ru) with a thickness of about 20 nm to about 80 nm. Alternatively, the capping layer 130 may include silicon dioxide (SiO$_2$), amorphous carbon or other suitable compositions. A low temperature deposition process is often chosen for the capping layer to prevent interdiffusion of the ML 120.

An absorption layer 140 is formed on the capping layer 130. The absorption layer 140 absorbs radiation in the EUV wavelength ranges projected onto the patterned EUV mask. The absorption layer 140 may include chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, and/or mixture of some of the above. The absorption layer 140 may be formed of a single layer. That is, the absorption layer 140 is a single piece of continuous material. The absorption layer 140 may be any suitable thickness for a given material to achieve an adequate absorption.

The absorption layer 140 has at least one test pattern therein. For example, as shown in FIGS. 1 and 2A, the absorption layer 140 has a test pattern (or a pair of test trenches) 210. Specifically, the test pattern 210 includes a first trench 212 and a second trench 214 adjacent to the first trench 212. Therefore, the test pattern 210 is a double-slit pattern. The first trench 212 and the second trench 214 have substantially the same dimension in the top view (i.e., in FIG. 1) but have different depths (i.e., in FIG. 2A). Specifically, each of the first trench 212 and the second trench 214 has a length L1 and a width W1 in the top view. Further, the first trench 212 and the second trench 214 define a lateral distance LD1 therebetween. The first trench 212 has a depth D1, and the second trench 214 has a depth D2 shallower than the depth D1. Both the first trench 212 and the second trench 214 are shallower than a thickness T1 of the absorption layer 140. Therefore, a portion 142 directly below the first trench 212 has a thickness T2 and a portion 144 directly below the second trench 214 has a thickness T3 greater than the thickness T2.

The absorption layer 140 further has at least one reference pattern therein. For example, as shown in FIGS. 1 and 2B, the absorption layer 140 has a reference pattern (or a pair of reference trenches) 260. The reference pattern 260 includes a first trench 262 and a second trench 264 adjacent to the first trench 262. Therefore, the reference pattern 260 is a double-slit pattern. The first trench 262 and the second trench 264 have substantially the same dimension both in the top view (i.e., in FIG. 1) and in the cross-sectional view (i.e., in FIG. 2B). Further, the first trench 262 and the second trench 264 of the reference pattern 260 and the first trench 212 and the second trench 214 of the test pattern 210 have substantially the same dimension in the top view. Specifically, each of the first trench 262 and the second trench 264 has a length L2 and a width W2 substantially the same as the length L1 and the width W1 of the first trench 212 and the second trench 214. Further, the first trench 262 and the second trench 264 define a lateral distance LD2, which is substantially equal to the lateral distance LD1 of the test pattern 210, therebetween. The first trench 262 has a depth D3, and the second trench 264 has a depth D4 substantially the same as the depth D3. Further, the depths D4 and D3 are substantially the same as the depth D1 of the first trench 212. That is, both the first trench 262 and the second trench 264 are shallower than the thickness T1 of the absorption layer 140. Therefore, a portion 146 directly below the first trench 262 has a thickness T4 and a portion 148 directly below the second trench 264 has a thickness T5 substantially the same as the thickness T4 (and the thickness T2).

Figure 3:
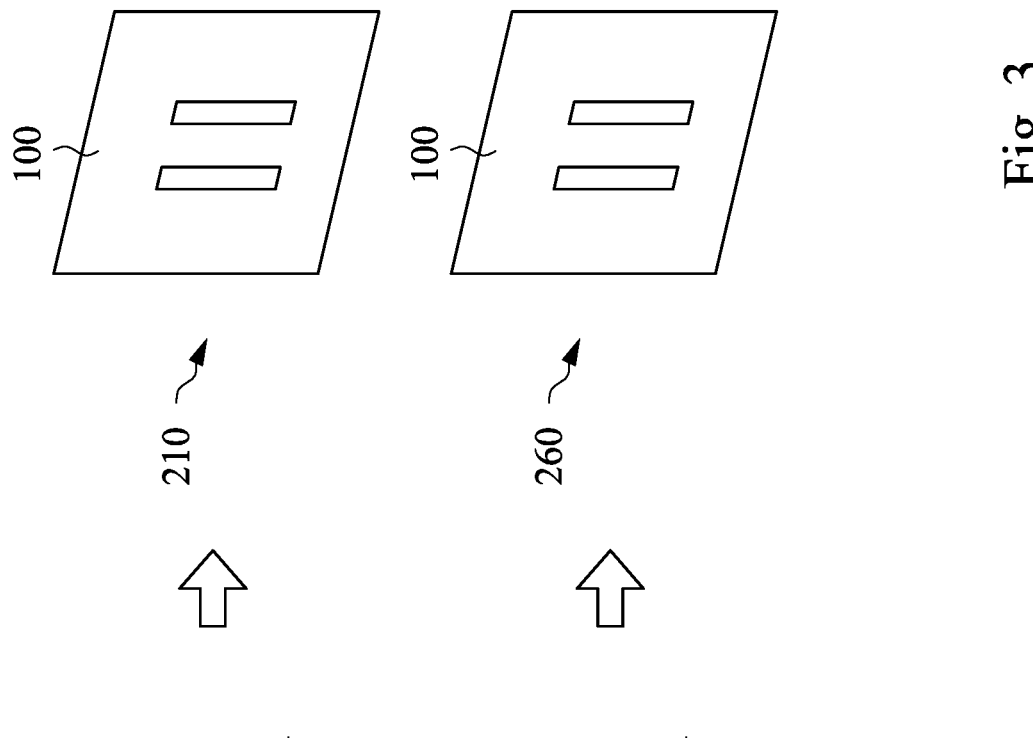
FIG. 3 is an illustrative diagram of measurement of double-slit interference experiments with the test pattern and the reference pattern of FIG. 1.

The complex refractive index (Nnk=n+ik) can be measured by using the test pattern 210 and the reference pattern 260. FIG. 3 is an illustrative diagram of measurement of double-slit interference experiments with the test pattern 210 and the reference pattern 260 of FIG. 1. A light beam LB emits the test pattern 210 and the reference pattern 260 in sequence. When the light beam LB propagating in the first trench 212 and the second trench 214 of the test pattern 210, two reflective light waves originating from the first trench 212 and the second trench 214 overlap, and the superposition of the overlapping two reflective light waves form an interference pattern 510. When the light beam LB propagating in the first trench 262 and the second trench 264 of the reference pattern 260, two reflective light waves originating from the first trench 262 and the second trench 264 overlap, and the superposition of the overlapping two reflective light waves form an interference pattern 520. Since the test pattern 210 and the reference pattern 260 have different dimension in the cross-sectional view, the interference patterns 510 and 520 are different. The difference between the interference patterns 510 and 520 can calculate the n value and the k value of the complex refractive index of the absorption layer 140 by using the principle of interference.

In greater detail, the difference between the interference patterns 510 and 520 is caused by the thickness difference between the thicknesses T2 and T3 of the portions 142 and 144 of the absorption layer 140. The light waves propagating in the portions 142 and 144 have different propagation lengths, resulting in different phases when they leave the absorption layer 140. Thus, the superposition of the overlapping two reflective light waves propagating in the portions 142 and 144 forms the interference pattern 510 that is different from the interference pattern 520. The waveforms of the waves are determined by the complex refractive index of the absorption layer 140 and the propagation lengths of the waves. With the predetermined propagation lengths (i.e., the thicknesses T2, T3, T4, and T5), by comparing the interference patterns 510 and 520, the complex refractive index of the absorption layer 140 can be obtained.

Reference is made to FIGS. 1-2B. In some embodiments, the absorption layer 140 has a plurality of the test patterns and a plurality of the reference patterns to obtain more precise n and k values. For example, the absorption layer 140 further has test patterns 220 and 230. Specifically, the test pattern 220 includes a first trench 222 and a second trench 224 adjacent to the first trench 222. The first trench 222 and the second trench 224 have substantially the same dimension in the top view (i.e., in FIG. 1) but have different depths (i.e., in FIG. 2A). Specifically, each of the first trench 222 and the second trench 224 has a length L3 and a width W3 in the top view. Further, the first trench 222 and the second trench 224 define a lateral distance LD3 therebetween. The first trench 222 has a depth D5, and the second trench 224 has a depth D6 shallower than the depth D5. Both the first trench 222 and the second trench 224 are shallower than the thickness T1 of the absorption layer 140. The test pattern 230 includes a first trench 232 and a second trench 234 adjacent to the first trench 232. The first trench 232 and the second trench 234 have substantially the same dimension in the top view (i.e., in FIG. 1) but have different depths (i.e., in FIG. 2A). Specifically, each of the first trench 232 and the second trench 234 has a length L5 and a width W5. Further, the first trench 232 and the second trench 234 define a lateral distance LD5 therebetween. The first trench 232 has a depth D9, and the second trench 214 has a depth D10 shallower than the depth D9. Both the first trench 232 and the second trench 234 are shallower than the thickness T1 of the absorption layer 140.

At least one dimension parameter of the test patterns 210, 220, and 230 is different. In some embodiments, the test patterns 210 and 220 have the same dimension except the widths (i.e., the width W3 is greater than the width W1). In some embodiments, the test patterns 210 and 230 have the same dimension except the lateral distances (i.e., the lateral distance LD5 is greater than the lateral distance LD1). In some embodiments, the first trenches 212, 222, and 232 have substantially the same depths D1, D5, and D9, and the second trenches 214, 224, and 234 have substantially the same depths D2, D6, and D10.

Further, a lateral distance between adjacent test patterns is greater than the lateral distance of first and second trenches of a single test pattern. For example, a lateral distance LD7 between the test patterns 210 and 220 is greater than the lateral distances LD1 and LD3, and a lateral distance LD8 between the test patterns 220 and 230 is greater than the lateral distances LD3 and LD5. As such, the interference pattern 510 does not include the signals propagating through the test pattern 220, or the signals propagating through the test pattern 220 are ignorable.

Reference is made to FIGS. 1 and 2B. The absorption layer 140 further has reference patterns 270 and 280. Specifically, the reference pattern 270 includes a first trench 272 and a second trench 274 adjacent to the first trench 272. The first trench 272 and the second trench 274 have substantially the same dimension both in the top view (i.e., in FIG. 1) and in the cross-sectional view (i.e., in FIG. 2B). Further, the first trench 272 and the second trench 274 of the reference pattern 270 and the first trench 222 and the second trench 224 of the test pattern 220 have substantially the same dimension in the top view. Specifically, each of the first trench 272 and the second trench 274 has a length L4 and a width W4 substantially the same as the length L3 and the width W3 of the first trench 222 and the second trench 224. Further, the first trench 272 and the second trench 274 define a lateral distance LD4, which is substantially equal to the lateral distance LD3 of the test pattern 220, therebetween. The first trench 272 has a depth D7, and the second trench 274 has a depth D8 substantially the same as the depth D7. Further, the depths D8 and D7 are substantially the same as the depth D5 of the first trench 222. That is, both the first trench 272 and the second trench 274 are shallower than the thickness T1 of the absorption layer 140.

The reference pattern 280 includes a first trench 282 and a second trench 284 adjacent to the first trench 282. The first trench 282 and the second trench 284 have substantially the same dimension both in the top view (i.e., in FIG. 1) and in the cross-sectional view (i.e., in FIG. 2B). Further, the first trench 282 and the second trench 284 of the reference pattern 280 and the first trench 232 and the second trench 234 of the test pattern 230 have substantially the same dimension in the top view. Specifically, each of the first trench 282 and the second trench 284 has a length L6 and a width W6 substantially the same as the length L5 and the width W5 of the first trench 232 and the second trench 234. Further, the first trench 282 and the second trench 284 define a lateral distance LD6, which is substantially equal to the lateral distance LD5 of the test pattern 230, therebetween. The first trench 282 has a depth D11, and the second trench 284 has a depth D12 substantially the same as the depth D11. Further, the depths D12 and D11 are substantially the same as the depth D9 of the first trench 232. That is, both the first trench 282 and the second trench 284 are shallower than the thickness T1 of the absorption layer 140.

Further, a lateral distance between adjacent reference patterns is greater than the lateral distance of first and second trenches of a single reference pattern. For example, a lateral distance LD9 between the reference patterns 260 and 270 is greater than the lateral distances LD2 and LD4, and a lateral distance LD10 between the reference patterns 270 and 280 is greater than the lateral distances LD4 and LD6. As such, the interference pattern 520 does not include the signals propagating through the reference pattern 270, or the signals propagating through the reference pattern 270 are ignorable.

The test patterns 210, 220, and 230 and the reference patterns 260, 270, and 280 can be measured and be compared. For example, a double-slit interference measurement of the test pattern 220 and the reference pattern 270 can be performed, and the interference patterns of the test pattern 220 and the reference pattern 270 can be compared to obtain another measured n value and k value of the absorption layer 140. Similarly, another double-slit interference measurement of the test pattern 230 and the reference pattern 280 can be performed, and the interference patterns of the test pattern 230 and the reference pattern 280 can be compared to obtain still another measured n value and k value of the absorption layer 140. The plural measured n values and k values can be averaged to gain the accuracy of the n value and k value of the absorption layer 140.

It is understood that three pairs of the test patterns 210, 220, and 230 and three pairs of the reference patterns 260, 270, and 280 are illustrated for purposes of illustration, but other embodiments may include any number of the pairs of the test patterns and the reference patterns. In some embodiments, tens or hundreds or more pairs of the test patterns and the reference patterns are formed in the absorption layer 140. Further, at least one dimension parameter (e.g., lateral distance, width, thickness) of the test patterns 210, 220, and 230 is different. Also, the locations of the test patterns 210, 220, and 230 and the reference patterns 260, 270, and 280 are also illustrated for purposes of illustration, but other embodiments may include any number of the pairs of the test patterns and the reference patterns.

In some embodiments, each of the thicknesses T2-T5 is in a range from about 5 nm to about 100 nm. If each of the thicknesses T2-T5 is smaller than about 5 nm, the signals of the complex refractive index in the interference patterns 510 and 520 may be insufficient; if each of the thicknesses T2-T5 is greater than about 100 nm, the light beam LM may be absorbed by the absorption layer 140 too much and thus the signal-to-noise ratio of the interference patterns 510 and 520 may be low, where the noise is attributed to the light reflected from other regions of the absorption layer 140 near the measured test pattern or the measured reference pattern.

In some embodiments, a depth difference between the first trench 212 (or 222 or 232) and the second trench 214 (or 224 or 234) is greater than 0 but equal to or smaller than about 95 nm. If the depth difference is greater than about 95 nm, the intensities of the two reflective light waves may have a great difference, resulting in an unobvious interference pattern.

In some embodiments, each of the widths W1-W6 is in a range from about 20 nm to about 1000 nm, each of the lateral distance LD1-LD6 is in a range from about 0.5 um to about 20 um, the thickness T1 of the absorption layer 140 is in a range from about 5 nm to about 100 nm, each of the depths D1-D12 is in a range from about 5 nm to about 100 nm, and/or each of the depths D1-D4 is in a range from about 5 nm to about 100 nm. If the aforementioned dimensions are out of the above selected ranges, the test patterns 210, 220, 230 and the reference patterns 260, 270, 280 may be unsatisfactory for obtaining the precise n value and k value of the absorption layer 140.

FIGS. 4A-9B illustrate a method for manufacturing the test photomask 100 at various stages in accordance with some embodiments of the present disclosure. FIGS. 4A, 5A, 6A, 7A, 8A, and 9A are cross-sectional views of some embodiments of the method for manufacturing the test photomask 100 at intermediate stages during fabrication along the line A-A in FIG. 1, and FIGS. 4B, 5B, 6B, 7A, 8A, and 9B are cross-sectional views of some embodiments of the method for manufacturing the test photomask 100 at intermediate stages during fabrication along the line B-B in FIG. 1.

Figure 4A:
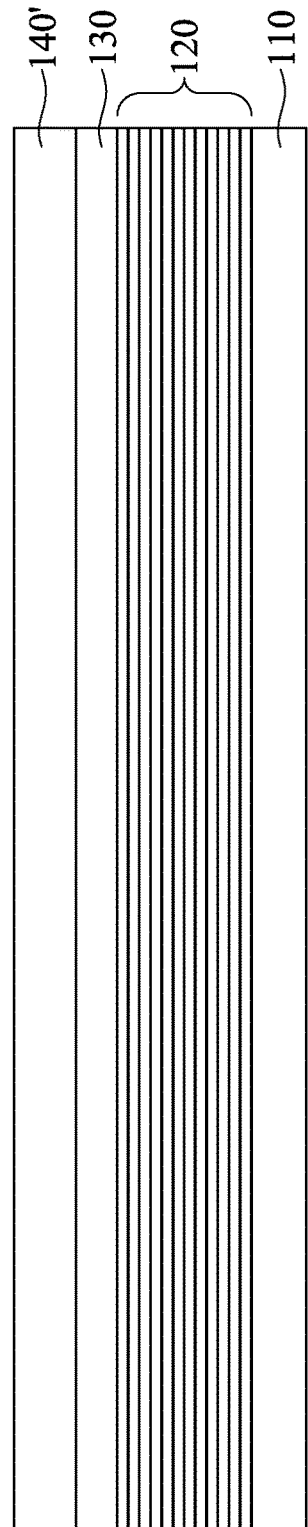
Figure 4B:
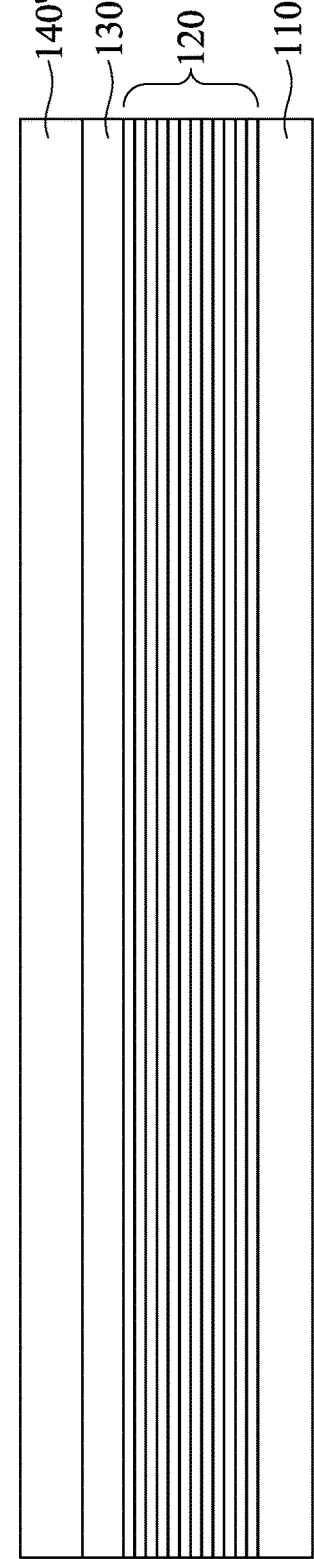

Reference is made to FIGS. 4A and 4B. A photomask structure 105 is provided. The photomask structure 105 includes the substrate 110, the reflective ML 120, the capping layer 130, and an absorption layer 140', which may be a layer without patterns (e.g., trenches) therein. The reflective ML 120 is deposited on the top of the substrate 110. The capping layer 130 is deposited on top of the reflective ML 120. The absorption layer 140' is then deposited on top of the capping layer 130. One or more of the layers 120, 130 and 140' may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art.

Figures 5A, 5B:
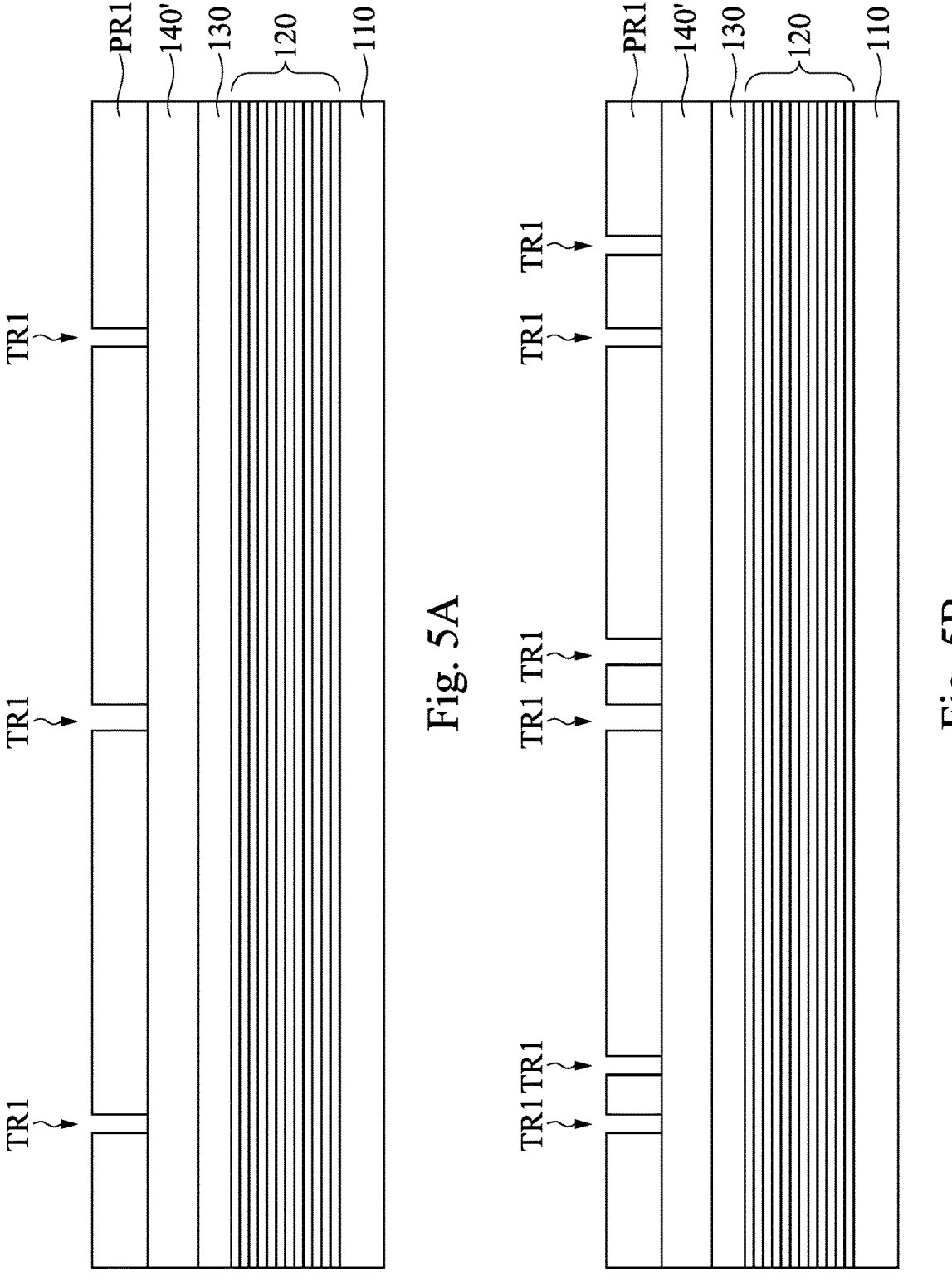

Reference is made to FIGS. 5A and 5B. A first patterned photoresist PR1 is formed on the absorption layer 140', and the first patterned photoresist PR1 has a plurality of trenches TR1 therein. Top views of the trenches TR1 may be the same as top views of the first openings 212, 222, 232, 262, 272, 282, and the second openings 264, 274, and 268 in FIG. 1.

Figures 6A, 6B:
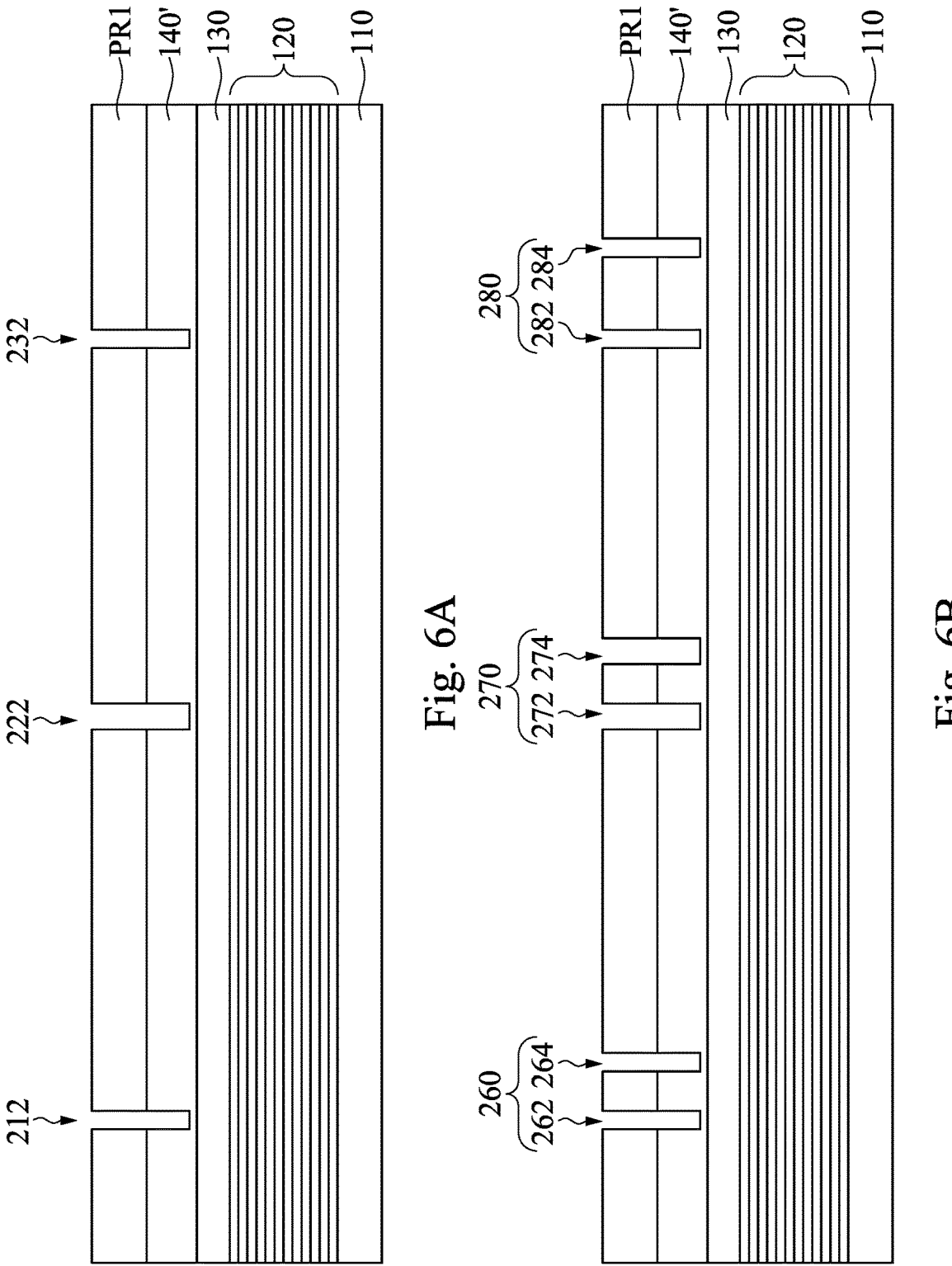

Reference is made to FIGS. 6A and 6B. An etching process is performed to form the first openings 212, 222, 232, 262, 272, 282, and the second openings 264, 274, and 284 in the absorption layer 140' by using the first patterned photoresist PR1 as an etch mask. Therefore, the first openings 212, 222, 232, 262, 272, 282, and the second openings 264, 274, and 284 have substantially the same depths in the cross-sectional view. In some embodiments, the etching process may be an E-beam etching process or a laser-beam etching process, such that the dimensions of the first openings 212, 222, 232, 262, 272, 282, and the second openings 264, 274, and 284 can be well controlled.

Figure 7A:
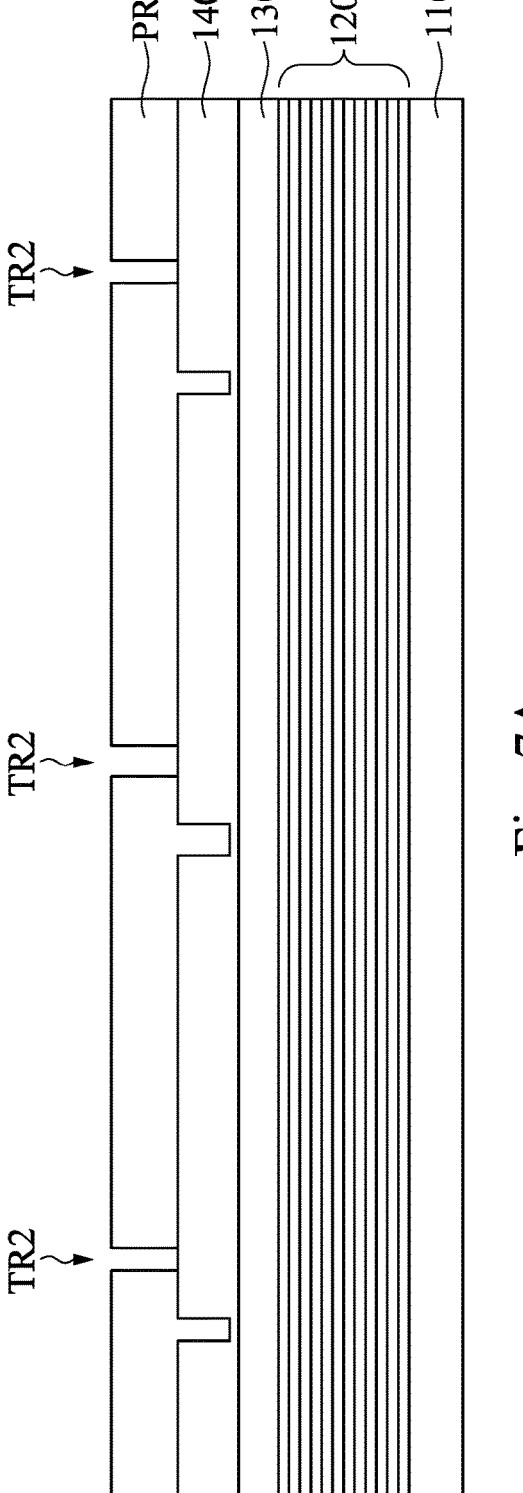
Figure 7B:
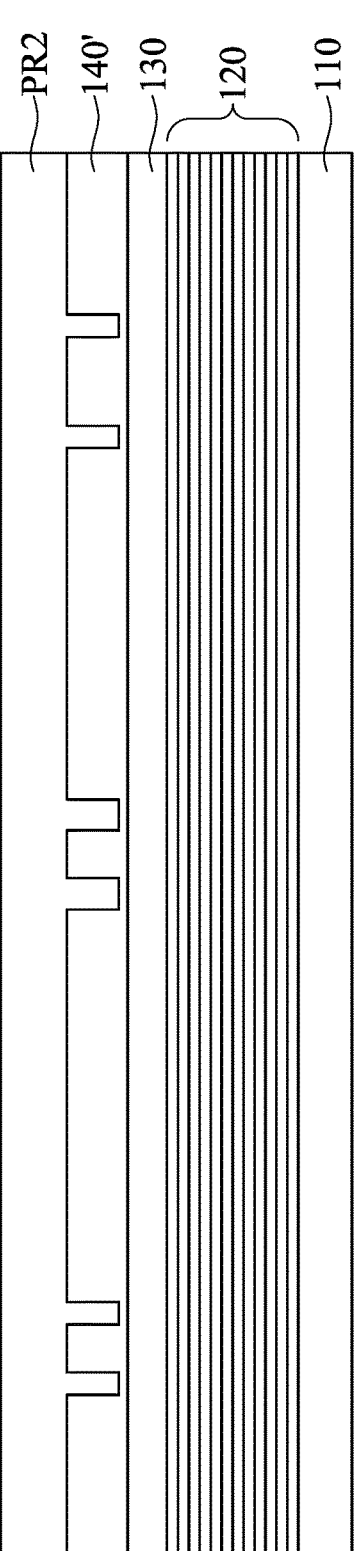

Reference is made to FIGS. 7A and 7B. The first patterned photoresist PR1 (see FIGS. 6A and 6B) is removed thereafter using a suitable process, such as wet stripping or plasma ashing. A second patterned photoresist PR2 is formed on the absorption layer 140', and the second patterned photoresist PR2 has a plurality of trenches TR2 therein. Top views of the trenches TR2 may be the same as top views of the second openings 214, 224, and 234 in FIG. 1.

Figure 8A:
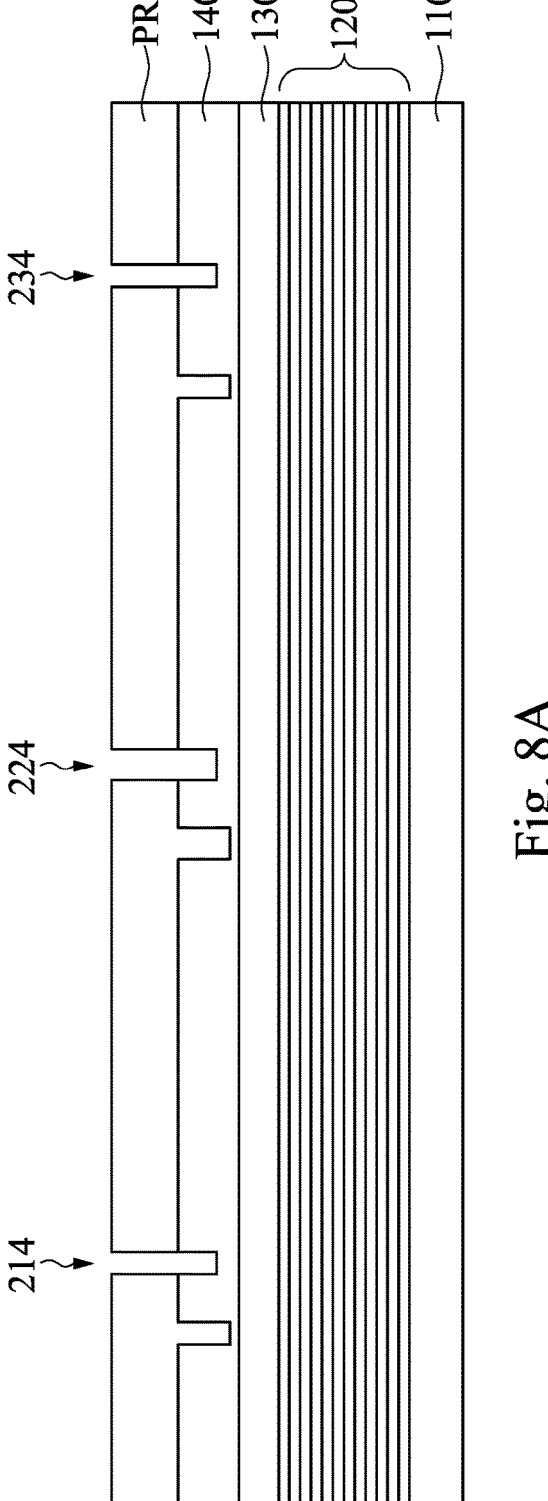
Figure 8B:
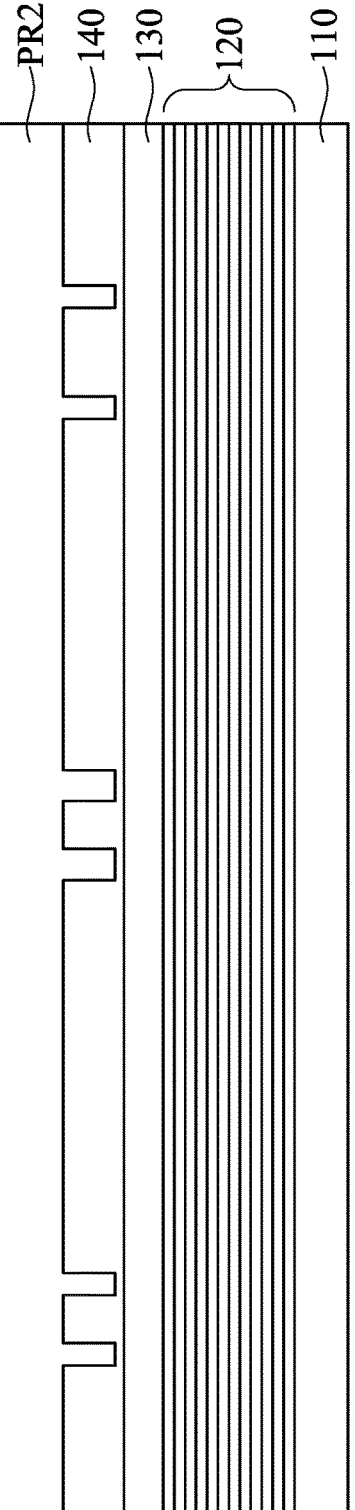

Reference is made to FIGS. 8A and 8B. An etching process is performed to form the second openings 214, 224, and 234 in the absorption layer 140 by using the second patterned photoresist PR2 as an etch mask. Therefore, the second openings 214, 224, and 234 have substantially the same depths in the cross-sectional view. In some embodiments, the etching process may be an E-beam etching process or a laser-beam etching process, such that the dimensions of the second openings 214, 224, and 234 can be well controlled.

Reference is made to FIGS. 2A and 2B. The second patterned photoresist PR2 (see FIGS. 8A and 8B) is removed thereafter using a suitable process, such as wet stripping or plasma ashing. Thereafter, the formation of the test photomask 100 is completed. In some other embodiments, the operations in FIGS. 5A-6B and FIGS. 7A-8B can be switched. That is, the second openings 214, 224, and 234 can be formed prior to the formation of the first openings 212, 222, 232, 262, 272, 282, and the second openings 264, 274, and 284.

Figures 9A, 9B:
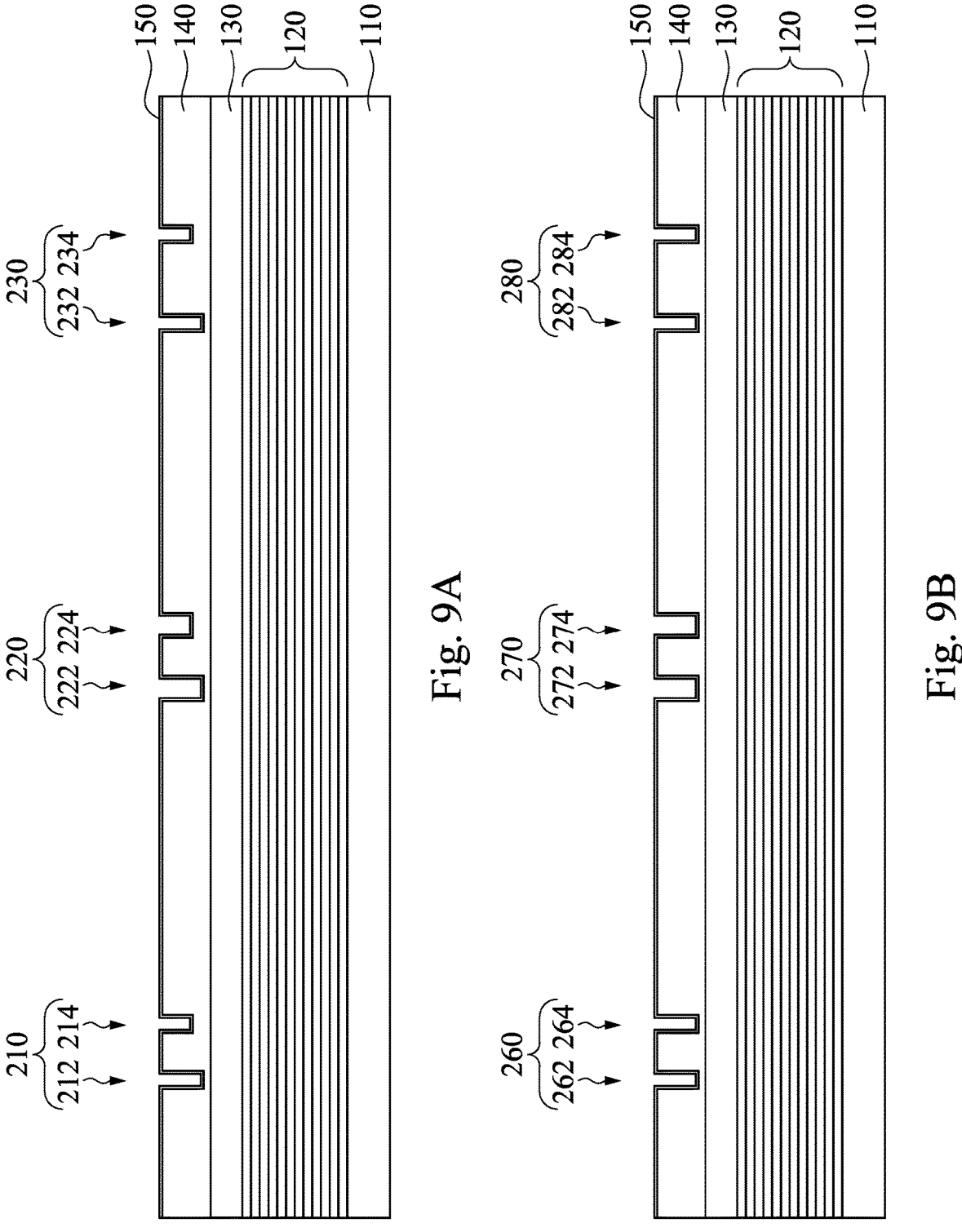

Reference is made to FIGS. 9A and 9B. In some embodiments, when the test photomask 100 is exposed to air, molecular layers of moisture adsorb on the absorption layer 140 instantly. Oxygen from the surrounding is dissolved into the absorption layer 140 and penetrates into the absorption layer 140. This process causes the surface of the absorption layer 140 to oxidize, even at room temperature. This thin oxide layer is called native oxide. After the removal of the second patterned photoresist PR2, a native oxide layer 150 may exist over the absorption layer 140 and lines inner sidewalls and bottom surfaces of the first openings 212, 222, 232, 262, 272, 282, and the second openings 214, 224, 234, 264, 274, and 284.

The native oxide layer 150 has a constant thickness. As such, even though the native oxide layer 150 is deposited in the first openings 212, 222, 232 and the second openings 214, 224, 234 of the absorption layer 140, the thickness difference thereof is still the same, such that the factor of the native oxide layer 150 in the interference patterns 510 and 520 can be canceled out. That is, the measured n value and the k value of the absorption layer 140 can be accuracy even the test photomask 100 includes the native oxide layer 150.

Figure 10:
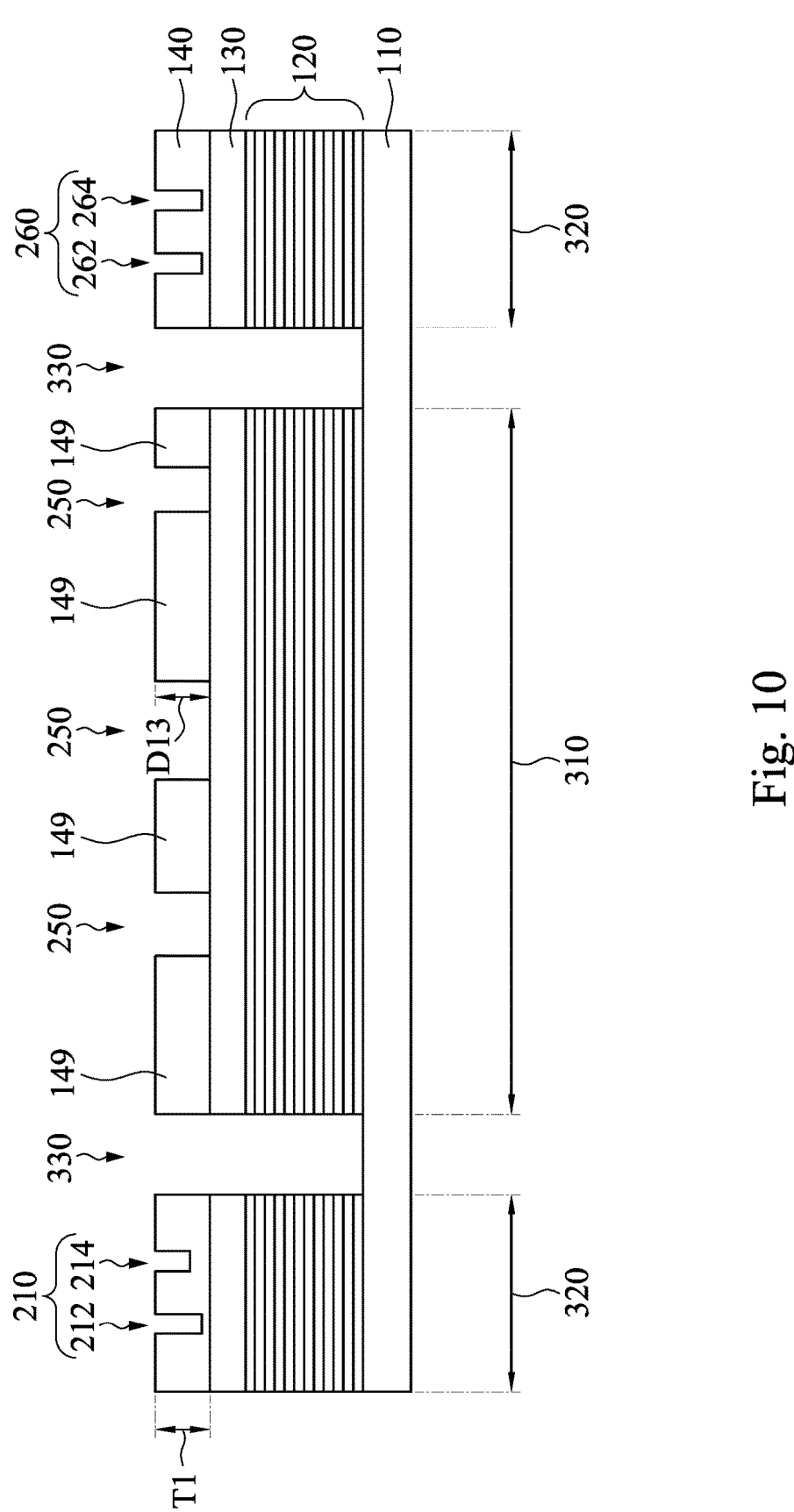
FIG. 10 is a cross-sectional view of a photomask in accordance with some embodiments.

FIG. 10 is a cross-sectional view of a photomask 100' in accordance with some embodiments. The photomask 100' includes a substrate 110, a reflective ML 120, a capping layer 130, and an absorption layer 140. Materials, configurations, and/or dimensions regarding the substrate 110, the reflective ML 120, the capping layer 130, and the absorption layer 140 of the photomask 100' are similar to or the same as the substrate 110, the reflective ML 120, the capping layer 130, and the absorption layer 140 of FIG. 4A, respectively.

The photomask 100' has a pattern region 310 and a border region 320. The pattern region 310 is located relative to a center of the photomask 100'. The border region 320 may surround the pattern region 310 and be separated from the pattern region 310 by a deep trench 330. The deep trench 330 may partially or entirely surround the pattern region 310. As shown in FIG. 10, the deep trench 330 extends through the absorption layer 140, the capping layer 130, and the reflective ML 120 to expose the substrate 110.

In some embodiments, the absorption layer 140 in the pattern region 310 may be patterned according to an IC layout pattern (or simply IC pattern). For example, the absorption layer 140 may be patterned to form opaque regions 149 and reflective regions (or trenches) 250. In the opaque region 149, the absorption layer 140 may be remained. An incident light is almost fully absorbed by the opaque regions 149. In the reflective regions 250, the absorption layer 140 may be removed and the incident light is reflected by the underlying reflective ML 120.

The absorption layer 140 further has a plurality of test patterns and reference patterns located in the border region 320. For example, the absorption layer 140 has at least one test pattern 210 and at least one reference pattern 260. The details of the test pattern 210 and the reference pattern 260 are described above, and are not repeated hereinafter. In some other embodiments, the absorption layer 140 has a plurality of the test patterns and reference patterns, e.g., the patterns 210, 220, 230, 260, 270, 280 or more, located in the border region 320.

The reflective regions 250 are deeper than the first trench 212 and the second trench 214 of the test pattern 210 and the first trench 262 and the second trench 264 of the test pattern 260. In greater detail, the reflective regions 250 each has a depth D13 substantially the same as the thickness T1 of the absorption layer 140. That is, the reflective regions 250 expose the top surface of the capping layer 130. In some other embodiments, the reflective regions 250 extend through the capping layer 130 and expose the top surface of the reflective ML 120. Other relevant structural details of the photomask 100' are the same as or similar to the test photomask 100, and, therefore, a description in this regard will not be repeated hereinafter.

Figures 11, 12:
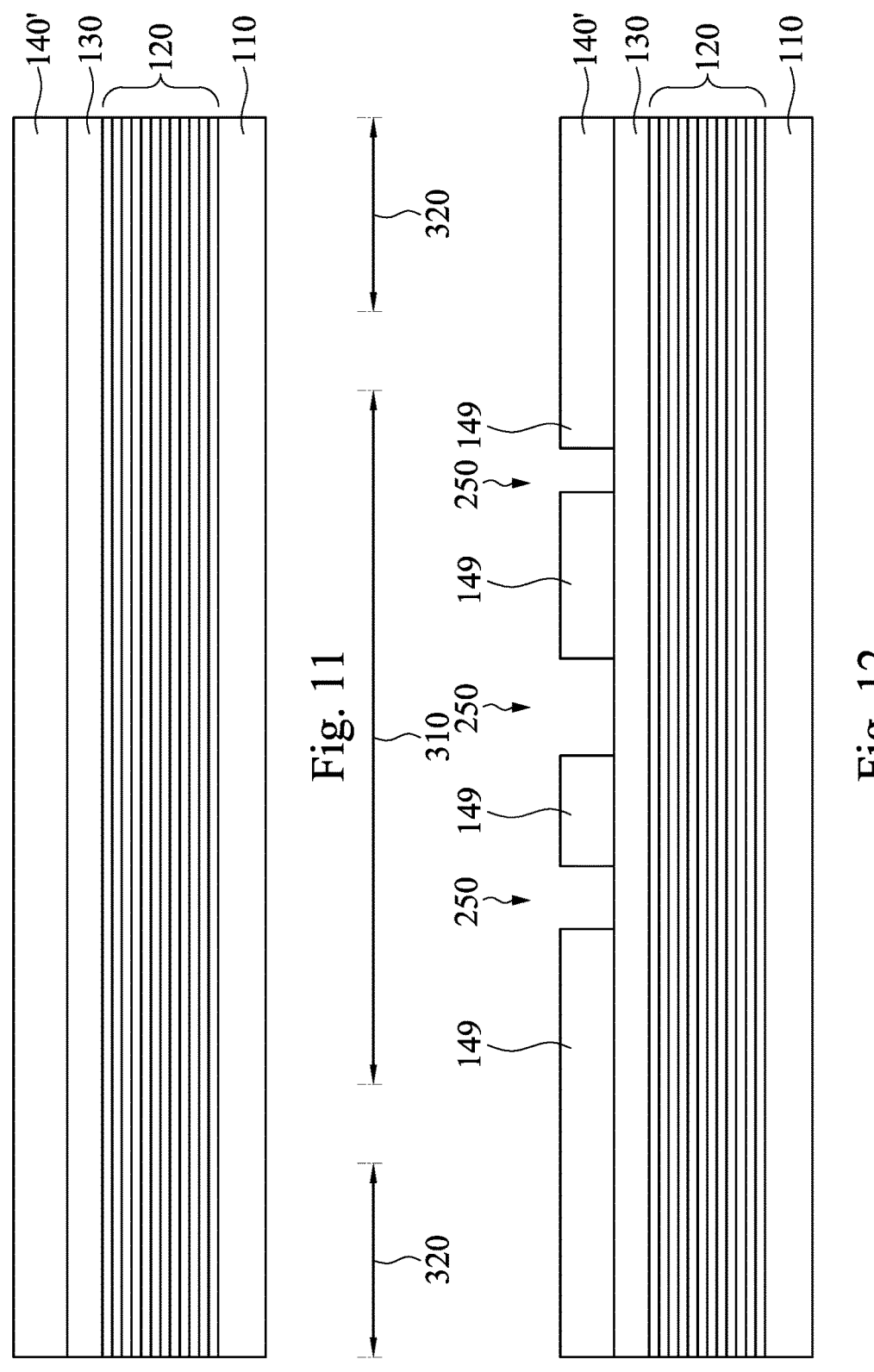
FIGS. 11-15 illustrate a method for manufacturing the photomask at various stages in accordance with some embodiments of the present disclosure.

FIGS. 11-15 illustrate a method for manufacturing the photomask 100' at various stages in accordance with some embodiments of the present disclosure. Reference is made to FIG. 11. A photomask structure 105 (which may be similar to the photomask structure 105 in FIGS. 4A and 4B) is provided.

Reference is made to FIG. 12. Subsequently, portions of the absorption layer 140' are etched to form the absorption pattern 250 over the reflective ML 120. The patterning process includes resist coating (e.g., spin-on coating), soft baking, target aligning, exposure, post-exposure baking, developing the resist, rinsing, drying (e.g., hard baking), other suitable processes, and/or combinations thereof. Alternatively, the photolithography exposing process is implemented or replaced by other proper methods such as maskless photolithography, electron-beam writing, direct-writing, and/or ion-beam writing.

Next, an etching process is followed to remove portions of the absorption layer 140' to form the reflective regions 250. With the patterned resist layer serves as an etch mask, the underlying layer (e.g. the absorption layer 140') is etched through the openings of the patterned resist layer while the portion of the underlying layer covered by the resist layer remains. The etching process may include dry (plasma) etching, wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. After the etching process, the patterned resist layer may be removed by a suitable technique, such as stripping or ashing.

Figures 13, 14:
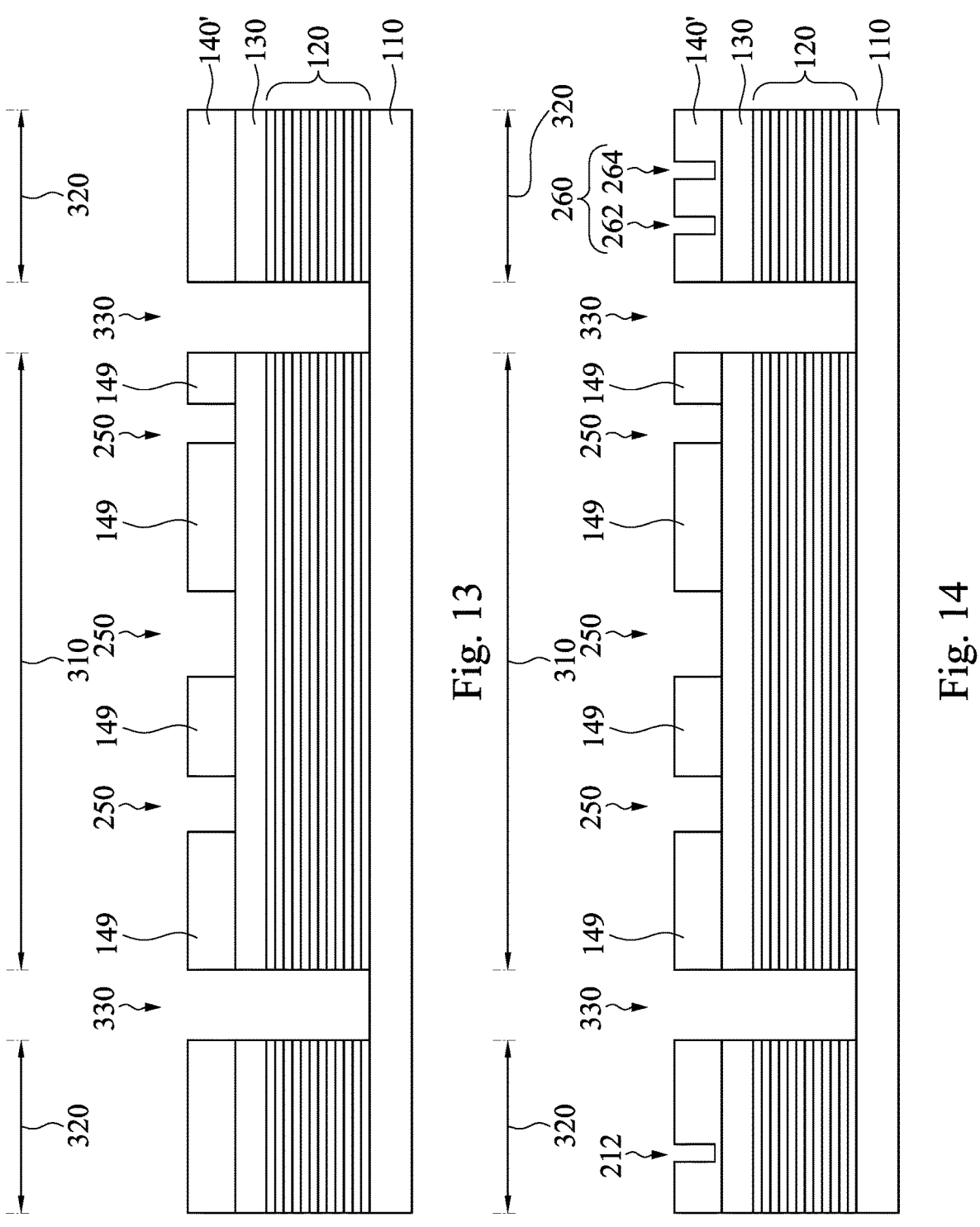

Reference is made to FIG. 13. The deep trench 330 is formed to define the pattern region 310 and the border region 320 of the photomask 100'. The deep trench 330 extends through the absorption pattern 140', the capping layer 130, and the reflective ML 120 to expose a portion of the substrate 110. The deep trench 330 may be formed by performing one or more suitable etching processes, such as forming a mask layer over the absorption layer 140', patterning the mask layer, and performing plural etching processes on the absorption layer 140', the capping layer 130 and the reflective ML 120 using the patterned mask layer as an etch mask. The etching process performed on the absorption pattern 140' can be similar as that discussed in FIG. 12.

Reference is made to FIG. 14. The first openings 212 and 262 and the second opening 264 are formed in the absorption layer 140'. The details of the formation of the first openings 212 and 262 and the second opening 264 are described in FIGS. 5A-6B, and are not repeated hereinafter.

Reference is made to FIG. 10. The second opening 214 is formed in the absorption layer 140. The details of the formation of the second opening 214 are described in FIGS. 7A-8B, and are not repeated hereinafter. Therefore, the test pattern 210 and the reference pattern 260 are formed. It is noted that more than one test patterns and more than one reference patterns can be formed during the processes shown in FIGS. 14 and 10.

Figure 15:
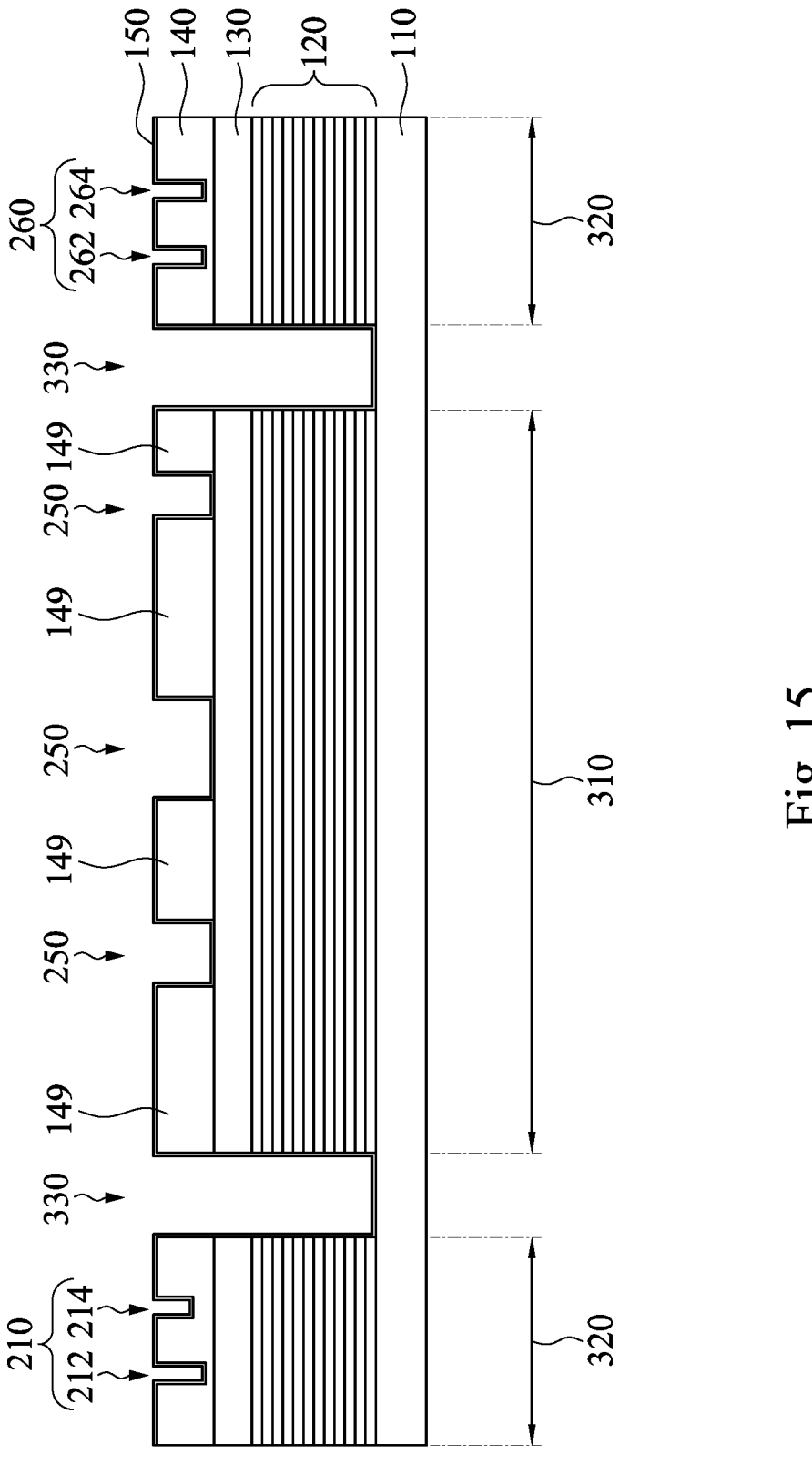

Reference is made to FIG. 15. In some embodiments, when the photomask 100' is exposed to air, molecular layers of moisture adsorb on the absorption layer 140 instantly. Oxygen from the surrounding is dissolved into the absorption layer 140 and penetrates into the absorption layer 140. This process causes the surface of the absorption layer 140 to oxidize, even at room temperature. This thin oxide layer is called native oxide. After the removal of the second patterned photoresist PR2, a native oxide layer 150 may exist over the absorption layer 140 and lines inner sidewalls and bottom surfaces of the trenches 212, 214, 262, 264, 250, and 330.

Figure 16:
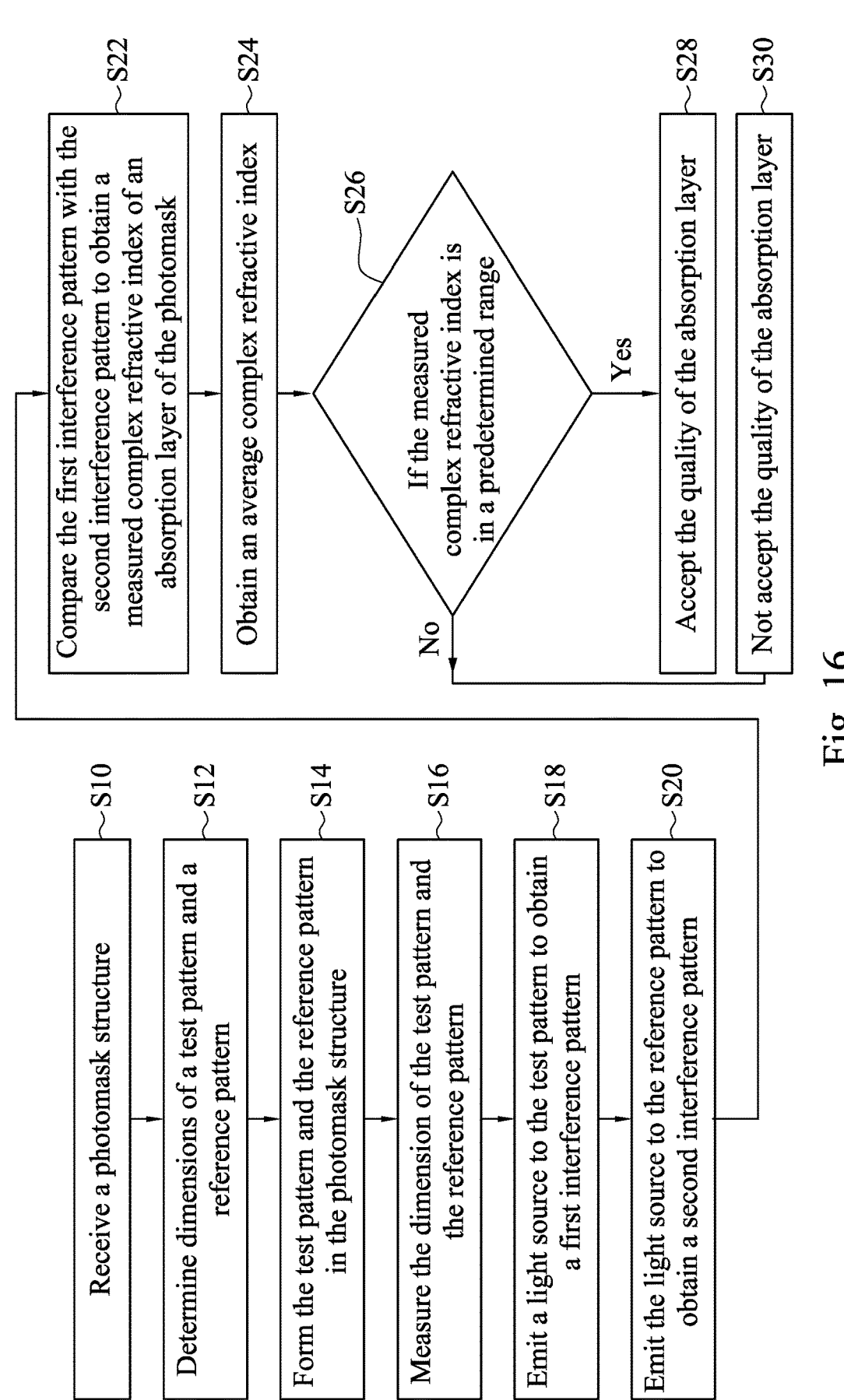
FIG. 16 is a flow chart illustrating a method for measuring the complex refractive index of the absorption layer in accordance with some embodiments.

FIG. 16 is a flow chart illustrating a method M1 for measuring the complex refractive index of the absorption layer 140 in accordance with some embodiments. For illustration, the flow chart will be described along with the drawings shown in FIGS. 1-15. Additional operations can be provided before, during, and after the method M1, and some of operations described can be replaced or eliminated for other embodiments of the method.

In operation S10, a photomask structure is received. For example, in FIGS. 4A-4B and 11, the photomask structure 105 is provided. In some embodiments, a plurality of the photomask structures 105 are manufactured in the same lot (having the same lot number), such that the material (and thus the optical performance) of the absorption layers 140 of the photomask structures 105 in the same lot is supposed to be the same or similar. Therefore, the complex refractive index of the absorption layers 140 of the photomask structures 105 can be determined by measuring a single photomask structure 105 thereof.

In operation S12, dimensions of a test pattern and a reference pattern are determined. For example, as shown in FIGS. 1-2B, parameters of the patterns (e.g., length, width, depth, thickness difference, and/or lateral distance) are determined. With suitable values (which are described above), the signal-to-noise ratio of the interference patterns is high, and thus the measured refractive index can be precise.

In operation S14, the test pattern and the reference pattern are formed in the photomask structure. As shown in FIGS. 4A-9B, at least the test pattern 210 and the reference pattern 260 are formed in the absorption layer 140 of the photomask structure 105 to form the test photomask 100. In some embodiments, as shown in FIGS. 11-15, reflective regions 250 and the deep trench 330 may be also formed in the photomask structure 105 to form the photomask 100'.

In operation S16, dimensions of the test pattern and the reference pattern are measured. As shown in FIGS. 1-2B and 10, the dimensions (e.g., widths, lengths, lateral distance between two trenches, and/or depths of the trenches) are measured by using, for example, an atomic force microscopy (AFM).

Figure 17:
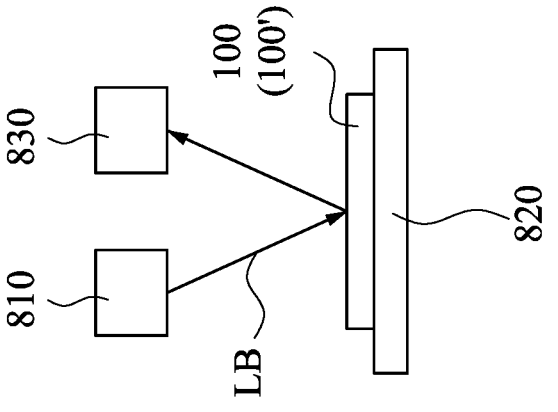
FIG. 17 is a schematic and diagrammatic view of an optical measurement device in accordance with some embodiments.

In operation S18, a light source is emitted to the test pattern to obtain a first interference pattern. FIG. 17 is a schematic and diagrammatic view of an optical measurement device 800 in accordance with some embodiments. The optical measurement device 800 includes a light source 810, a stage 820, and an image device 830. The light source 810 is configured to provide the light beam LM, the stage 820 is configured to support a sample (i.e., the test photomask 100 or the photomask 100'), and the image device 830 is configured to detect the light beam reflected from the sample.

As shown in FIGS. 3 and 17, the light beam LM is emitted to the test pattern 210 of the photomask 100 (or 100'). The light beam LM has a wavelength the same as or similar to a wavelength of a light beam used in a lithography exposure process with the photomask 100 (or 100'). For example, when the photomask 100 (or 100') is used in an EUV lithography exposure process, the light beam LM is an EUV light. When the light beam LM impinges on the test pattern 210 of the photomask 100 (or 100'), the light beam LM interferes and is reflected from the test pattern 210 to the image device 830. Therefore, the image device 830 obtains a first interference pattern (e.g., the interference pattern 510).

In some embodiments, the light beam LM is a coherent light, which is a beam of photons (almost like particles of light waves) that have substantially the same frequency and are all at substantially the same frequency, to produce the interference patterns. For example, the light beam LM is a laser light. In some embodiments, a high-order harmonic generation (HHG) is employed to produce the coherent EUV light.

In operation S20, the light source is emitted to the reference pattern to obtain a second interference pattern. As shown in FIGS. 3 and 17, either the light source 810 or the stage 820 moves such that the light beam LM is emitted to the reference pattern 260 of the photomask 100 (or 100'). When the light beam LM impinges on the reference pattern 260 of the photomask 100 (or 100'), the light beam LM interferes and is reflected from the reference pattern 260 to the image device 830. Therefore, the image device 830 obtains a second interference pattern (e.g., the interference pattern 520).

In operation S22, the first interference pattern is compared with the second interference pattern to obtain a measured complex refractive index of an absorption layer of the photomask. For example, the positions of bright and dark fringes of the interference patterns 510 and 520 are compared to obtain the refractive index.

Optionally, in operation S24, an average complex refractive index is obtained. As mentioned above, the photomask 100 (or 100') may have a plurality of test patterns and the reference patterns. Each pair of the test patterns and the reference patterns corresponds to a measured complex refractive index. The plural measured complex refractive indexes are then averaged to obtain the average complex refractive index.

In operation S26, determining if the measured (average) complex refractive index is in a predetermined range. In some embodiments, for an EUV photomask, the absorption layer 140 has a complex refractive index (at EUV light wavelength) with an n value in a range from about 0.8 to about 1 and a k value in a range from about 0.01 to about 0.1. If yes, in operation S28, the quality of the absorption layer is accepted. For example, the other photomask structures 105 (see FIGS. 4A-4B) from the same lot as the test photomask 100 can be used to produce photomasks for lithography exposure processes. On the other hand, the photomask 100' can be disposed in a lithography exposure apparatus to perform the lithography exposure processes.

Figure 18:
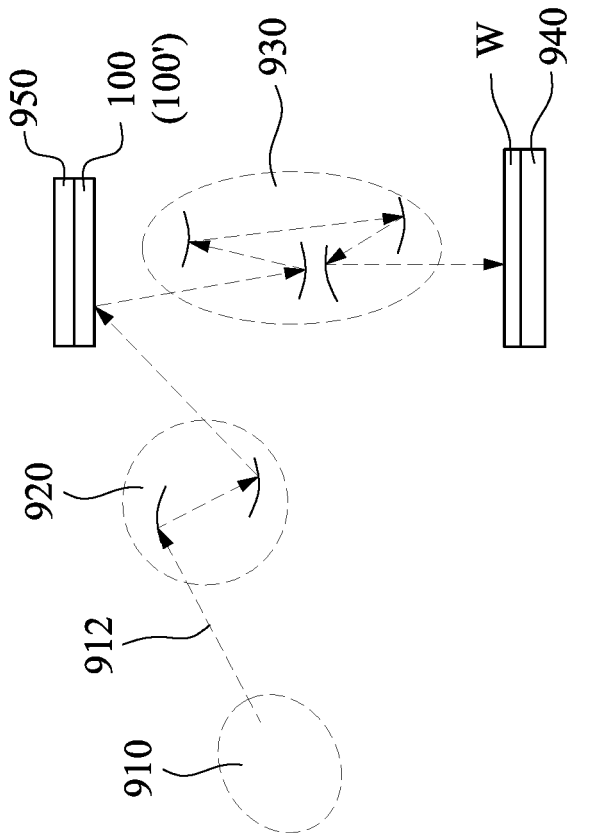
FIG. 18 is a schematic and diagrammatic view of a lithography exposure apparatus in accordance with some embodiments.

FIG. 18 is a schematic and diagrammatic view of a lithography exposure apparatus 900 in accordance with some embodiments. The lithography exposure apparatus 900 includes a light source 910, an illuminator 920, a projection optics module (or projection optics box (POB)) 930 and a substrate stage 940 in accordance with some embodiments. The light source 910 is configured to generate radiations 912 having a wavelength ranging between about 1 nm and about 100 nm. In some embodiments, the light source 910 generates an EUV light with a wavelength centered at about 13.5 nm. Accordingly, the light source 910 is also referred to as EUV light source. However, it should be appreciated that the light source 910 should not be limited to emitting EUV light. The light source 910 can be utilized to perform any high-intensity photon emission from excited target material.

In various embodiments, the illuminator 920 includes various refractive optic components, such as a single lens or a lens system having multiple lenses (zone plates) or alternatively reflective optics (for EUV lithography exposure apparatus), such as a single mirror or a mirror system having multiple mirrors in order to direct light from the light source 910 onto the photomask 100 (or 100'), particularly to the photomask 100 (or 100') secured on the reticle chuck 950. In the present embodiment where the light source 910 generates light in the EUV wavelength range, reflective optics is employed.

The projection optics module (or projection optics box (POB)) 930 is configured for imaging the pattern of the photomask 100 (or 100') on to a semiconductor wafer W secured on the substrate stage 940 of the lithography exposure apparatus 900 for a lithography exposure process. In some embodiments, the POB 930 has refractive optics (such as for a UV lithography exposure apparatus) or alternatively reflective optics (such as for an EUV lithography exposure apparatus) in various embodiments. The light directed from the photomask 100 (or 100'), carrying the image of the pattern defined on the mask, is collected by the POB 930. The illuminator 920 and the POB 930 are collectively referred to as an optical module of the lithography exposure apparatus 900.

During the lithography exposure processes, the qualified photomask (with an acceptable complex refractive index of the absorption layer 140) is loaded on the reticle chuck 950, and a semiconductor wafer W is loaded on the substrate chuck 940. The radiation 912 is emitted from the light source 910 to the photomask, and the radiation 912 is patterned and reflected from the photomask to the semiconductor wafer W to expose a photoresist layer formed on the semiconductor wafer W.

If no, in operation S30, the quality of the absorption layer is not accepted. For example, the photomask 100 (and other photomask structures 105 from the same lot) is/are revoked or scrapped. For the photomask 100', the photomask 100' is disqualified and may not be used in the lithography exposure processes.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the complex refractive index of the absorption layer is obtained by tuning a depth difference of two trenches of a test pattern, such that the factor of film thickness of the absorption layer (including the native oxide) can be minimized, and the accuracy of the complex refractive index is increased. Further, even the native oxide is formed in the test pattern and the reference pattern, the factor thereof can be canceled out by comparing the interference patterns of the test pattern and the reference pattern. Also, multiple pairs of the test pattern and the reference pattern with different dimensions can be measured and be averaged to gain the accuracy of the measured complex refractive index.

According to some embodiments, a method includes forming a test pattern and a reference pattern in an absorption layer of a photomask structure. The test pattern has a first trench and a second trench, the reference pattern has a third trench and a fourth trench, the test pattern and the reference pattern have substantially the same dimension in a top view, and the second trench is shallower than the first trench, the third trench, and the fourth trench. The method further includes emitting a light beam to the test pattern to obtain a first interference pattern reflected from the test pattern, emitting the light beam to the reference pattern to obtain a second interference pattern reflected from the reference pattern; and comparing the first interference pattern with the second interference pattern to obtain a measured complex refractive index of the absorption layer.

According to some embodiments, a photomask includes a substrate, a reflective multilayer, a capping layer, and an absorption layer. The reflective multilayer is over the substrate. The capping layer is over the reflective multilayer. The absorption layer is over the capping layer. The absorption layer has a test pattern and a reference pattern, the test pattern has a first trench and a second trench, the reference pattern has a third trench and a fourth trench, the test pattern and the reference pattern have substantially the same dimension in a top view, and the second trench is shallower than the first trench, the third trench, and the fourth trench.

According to some embodiments, a method includes forming a reflective multilayer over a substrate; depositing a capping layer over the reflective multilayer; depositing an absorption layer over the capping layer; etching the absorption layer to form a test pattern in the absorption layer; and etching the absorption layer to form a reference pattern in the absorption layer. The test pattern has a first trench and a second trench shallower than the first trench. The reference pattern has a third trench and a fourth trench having substantially the same depth. Each of the first trench, the second trench, the third trench, and the fourth trench does not expose the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a test pattern and a reference pattern in an absorption layer of a photomask structure, wherein the test pattern has a first trench and a second trench, the reference pattern has a third trench and a fourth trench, the test pattern and the reference pattern have substantially the same dimension in a top view, the second trench is shallower than the first trench, the third trench, and the fourth trench, the first trench, the third trench, and the fourth trench have substantially the same depth, the first trench, the second trench, the third trench, and the fourth trench extend in a same direction in the top view, the first trench and the second trench are spaced apart by a first distance, the third trench and the fourth trench are spaced apart by a second distance substantially the same as the first distance, and each of the first trench, the second trench, the third trench, and the fourth trench has a depth smaller than a thickness of the absorption layer;

emitting a light beam to the test pattern to obtain a first interference pattern reflected from the test pattern;

emitting the light beam to the reference pattern to obtain a second interference pattern reflected from the reference pattern; and comparing the first interference pattern with the second interference pattern to obtain a measured complex refractive index of the absorption layer.

2. The method of claim 1, further comprising:
determining the dimension of the test pattern prior to forming the test pattern and the reference pattern to reduce a signal-to-noise ratio of the first interference pattern.

3. The method of claim 1, further comprising:
measuring the dimension of the test pattern prior to emitting the light beam to the test pattern.

4. The method of claim 1, wherein the test pattern and the reference pattern are formed in a border region of the photomask structure.

5. The method of claim 4, further comprising:
forming a deep trench in the photomask structure to define a pattern region and the border region surrounding the pattern region.

6. The method of claim 5, further comprising:
forming reflective regions in the absorption layer and in the pattern region, wherein the reflective regions are deeper than the first trench but shallower than the deep trench.

7. The method of claim 1, further comprising:
when the measured complex refractive index is in a predetermined range, accepting other photomask structures from a lot comprising the measured photomask structure to form photomasks.

8. The method of claim 1, further comprising:
when the measured complex refractive index is in a predetermined range, using the measured photomask structure to perform a lithography exposure process.

9. The method of claim 1, further comprising:
when the measured complex refractive index is out of a predetermined range, revoking the photomask structure.

10. A method comprising:
providing a photomask structure, wherein the photomask structure has a border region and a pattern region surrounded by the border region, the photomask structure comprises a double-slit test pattern and a double-slit reference pattern in the border region and in an absorption layer of the photomask structure, slits of the double-slit test pattern have different depths, the double-slit test pattern and the double-slit reference pattern extend in a same direction and have substantially the same dimension in a top view, one of the slits of the double-slit test pattern and the slits of the double-slit reference pattern have the same depth, the slits of the double-slit test pattern are spaced apart by a first distance, and the slits of the double-slit reference pattern are spaced apart by a second distance substantially the same as the first distance, wherein a first portion of the absorption layer is directly under one of the slits of the double-slit test pattern, and a second portion of the absorption layer is directly under another one of the slits of the double-slit test pattern;
measuring a first interference pattern reflected from the double-slit test pattern;
measuring a second interference pattern reflected from the double-slit reference pattern; and
comparing the first interference pattern and the second interference pattern to obtain a measured complex refractive index of the absorption layer.

11. The method of claim 10, wherein the photomask structure further comprises reflective trenches in the absorp-
tion layer and in the pattern region, wherein the reflective trenches are deeper than the double-slit test pattern.

12. The method of claim 10, wherein the first distance between the slits of the double-slit test pattern is in a range from about 0.5 um to about 20 um.

13. The method of claim 10, further comprising:
determining whether the measured complex refractive index of the absorption layer is in a predetermined range; and
when the measured complex refractive index of the absorption layer is in the predetermined range, using the photomask structure to perform a lithography exposure process.

14. The method of claim 10, wherein the photomask structure further comprises an oxide layer lining sidewalls and bottom surfaces of the double-slit test pattern and the double-slit reference pattern.

15. The method of claim 10, wherein a depth difference between the slits of the double-slit test pattern is greater than 0 but equal to or smaller than about 95 nm.

16. A method comprising:
receiving a photomask structure comprising:
a substrate;
a reflective multilayer over the substrate;
an absorption layer over the reflective multilayer, wherein the absorption layer has a test pattern comprising a first trench and a second trench extending in a direction in a top view, the first trench is deeper than the second trench, the absorption layer further has a reference pattern comprising a third trench and a fourth trench extending in the direction in the top view, the first trench, the third trench, and the fourth trench have substantially the same depth, the first trench and the second trench are spaced apart by a first distance, the third trench and the fourth trench are spaced apart by a second distance substantially the same as the first distance, and the first trench, the second trench, the third trench, and the fourth trench have substantially the same dimension in the top view; and
a native oxide layer lining sidewalls and bottom surfaces of the test pattern and the reference pattern;
emitting a light beam to the test pattern to obtain a first interference pattern;
emitting the light beam to the reference pattern to obtain a second interference pattern; and
obtaining a measured complex refractive index of the absorption layer according to the first interference pattern and the second interference pattern.

17. The method of claim 16, wherein the light beam is a coherent light.

18. The method of claim 16, further comprising:
measuring a dimension of the test pattern prior to emitting the light beam to the test pattern.

19. The method of claim 16, wherein the absorption layer further has a reflective trench deeper than the test pattern and the reference pattern.

20. The method of claim 16, wherein the photomask structure further has a deep trench extending through the absorption layer and the reflective multilayer.

* * * * *